US009627378B2

(12) United States Patent
Ando et al.

(10) Patent No.: US 9,627,378 B2
(45) Date of Patent: Apr. 18, 2017

(54) METHODS OF FORMING FINFETS WITH LOCALLY THINNED CHANNELS FROM FINS HAVING IN-SITU DOPED EPITAXIAL CLADDING

(71) Applicant: International Business Machines Corporation, Armonk, NY (US)

(72) Inventors: Takashi Ando, Tuckahoe, NY (US); Robert H. Dennard, Croton-on-Hudson, NY (US); Isaac Lauer, Yorktown Heights, NY (US); Ramachandran Muralidhar, Mahopac, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/788,297

(22) Filed: Jun. 30, 2015

(65) Prior Publication Data
US 2017/0005090 A1    Jan. 5, 2017

(51) Int. Cl.
*H01L 27/088* (2006.01)
*H01L 29/78* (2006.01)
(Continued)

(52) U.S. Cl.
CPC ...... *H01L 27/0886* (2013.01); *H01L 21/0257* (2013.01); *H01L 21/02181* (2013.01);
(Continued)

(58) Field of Classification Search
CPC ................................................ H01L 29/66545
See application file for complete search history.

(56) References Cited

U.S. PATENT DOCUMENTS 6,812,075 B2 * 11/2004 Fried ................. H01L 29/66818
                                                                257/327
7,087,471 B2 *  8/2006 Beintner ............... H01L 29/785
                                                                438/151
(Continued)

FOREIGN PATENT DOCUMENTS

KR        100939112 B1     1/2010
KR        100991382 B1    11/2010

OTHER PUBLICATIONS

English Translation of KR100991382B1 by Kim, Kwang Ok; Hynix Semiconductor Inc., Nov. 2, 2010.
(Continued)

*Primary Examiner* — Marc Armand
*Assistant Examiner* — Younes Boulghassoul
(74) *Attorney, Agent, or Firm* — Louis J. Percello; Michael J. Chang, LLC

(57) ABSTRACT

In one aspect, a method of forming finFET devices is provided which includes patterning fins in a wafer; forming dummy gates over the fins; forming spacers on opposite sides of the dummy gates; depositing a gap fill oxide on the wafer, filling any gaps between the spacers; removing the dummy gates forming gate trenches; trimming the fins within the gate trenches such that a width of the fins within the gate trenches is less than the width of the fins under the spacers adjacent to the gate trenches, wherein u-shaped grooves are formed in sides of the fins within the gate trenches; and forming replacement gate stacks in the gate trenches, wherein portions of the fins adjacent to the replacement gate stacks serve as source and drain regions of the finFET devices.

15 Claims, 14 Drawing Sheets

(51) Int. Cl.
    H01L 29/66      (2006.01)
    H01L 21/02      (2006.01)
    H01L 21/8234    (2006.01)
    H01L 29/51      (2006.01)
    H01L 21/28      (2006.01)
    H01L 29/49      (2006.01)
    H01L 21/308     (2006.01)
    H01L 29/10      (2006.01)

(52) U.S. Cl.
    CPC .. *H01L 21/02192* (2013.01); *H01L 21/02532* (2013.01); *H01L 21/28079* (2013.01); *H01L 21/28088* (2013.01); *H01L 21/3081* (2013.01); *H01L 21/823431* (2013.01); *H01L 21/823437* (2013.01); *H01L 21/823468* (2013.01); *H01L 29/1037* (2013.01); *H01L 29/495* (2013.01); *H01L 29/4966* (2013.01); *H01L 29/517* (2013.01); *H01L 29/66545* (2013.01)

(56)            References Cited

U.S. PATENT DOCUMENTS 7,804,130  B1    9/2010   Fung
    8,153,492  B2    4/2012   Fung
    8,633,529  B2    1/2014   Juengling
    8,647,938  B1    2/2014   Baars et al.
    8,748,267  B2    6/2014   Wang et al.
    8,956,932  B2    2/2015   Cheng et al.
    9,502,408  B2 *  11/2016  Kerber ............... H01L 27/0886
    2013/0234204 A1* 9/2013   Kang ................. H01L 29/7851
                                                          257/190
    2013/0313610 A1* 11/2013  Sell .................. H01L 21/02532
                                                          257/192
    2014/0061723 A1  3/2014   Quenette
    2014/0239398 A1  8/2014   Cheng et al.
    2015/0076609 A1* 3/2015   Xie .................... H01L 29/785
                                                          257/365
    2016/0020149 A1* 1/2016   Kim ................. H01L 21/823431
                                                          438/14
    2016/0020150 A1* 1/2016   You ................. H01L 21/823878
                                                          438/218
    2016/0027775 A1* 1/2016   Akarvardar ......... H01L 27/0886
                                                          257/401

OTHER PUBLICATIONS

English Translation of KR100939112B1 by Kim, Kwang Ok; Hynix Semiconductor Inc., Jan. 28, 2010.
List of IBM Patents or Applications Treated as Related.

* cited by examiner

Before Fin Trim

After Fin Trim

US 9,627,378 B2

METHODS OF FORMING FINFETS WITH LOCALLY THINNED CHANNELS FROM FINS HAVING IN-SITU DOPED EPITAXIAL CLADDING

FIELD OF THE INVENTION

The present invention relates to fin field-effect transistor (finFET) logic devices, and more particularly, to finFET logic devices with u-shaped channels formed using a replacement gate process.

BACKGROUND OF THE INVENTION

FinFET logic devices include a source region and a drain region. A gate is present over at least a portion of each of the fins. The gate regulates charge flow between the source region and the drain region through the channel regions.

FinFET density scaling is limited in the gate direction by gate pitch. Gate pitch is limited by the space required to fit the gate length, spacers, and source and drain contacts. Gate length is limited by electrostatic control of the channel.

Given these design constraints, improved techniques for finFET density scaling would be desirable.

SUMMARY OF THE INVENTION

The present invention provides fin field-effect transistor (finFET) logic devices with u-shaped channels formed using a replacement gate process. In one aspect of the invention, a method of forming finFET devices is provided. The method includes the steps of: patterning fins in a wafer; forming dummy gates over portions of the fins that serve as channel regions of the finFET devices; forming spacers on opposite sides of the dummy gates; depositing a gap fill oxide on the wafer, filling any gaps between the spacers; removing the dummy gates forming gate trenches; trimming the fins within the gate trenches such that a width of the fins within the gate trenches is less than the width of the fins under the spacers adjacent to the gate trenches, wherein u-shaped grooves are formed in sides of the fins within the gate trenches; and forming replacement gate stacks in the gate trenches over the portions of the fins that serve as the channel regions of the finFET devices, wherein portions of the fins adjacent to the replacement gate stacks serve as source and drain regions of the finFET devices.

In another aspect of the invention, a FinFET device is provided. The FinFET device includes fins patterned in a wafer; and a gate stack over portions of the fins that serve as channel regions of the finFET device, wherein portions of the fins adjacent to the gate stack serve as source and drain regions of the finFET device, wherein a width of the fins under the gate stack is less than the width of the fins adjacent to the gate stack, and wherein u-shaped grooves are provided in sides of the fins under the gate stack.

A more complete understanding of the present invention, as well as further features and advantages of the present invention, will be obtained by reference to the following detailed description and drawings.

DETAILED DESCRIPTION OF PREFERRED EMBODIMENTS

As provided above, gate pitch is a notable design constraint on FinFET density scaling. Gate pitch is limited by the space required to fit the gate length, as well as the spacers, and source/drain contacts. Gate length is limited by electrostatic control of the channel. Advantageously, provided herein are techniques for fin field-effect transistor (finFET) device fabrication in which u-shaped channels are formed. This u-shaped channel configuration decouples the electrostatic channel length from the physical gate length, thus permitting better FinFET density scaling. U-shaped channels may also be employed in planar devices. For instance, fully-depleted metal-oxide semiconductor field-effect transistor (MOSFET) logic devices with u-shaped channels are described, for example, in U.S. patent Ser. No. 14/788,253, entitled "Fully-Depleted SOI MOSFET with U-Shaped Channel," the contents of which are incorporated by reference as if fully set forth herein.

In general, the present techniques employ a replacement gate finFET fabrication process. In a replacement gate process, a sacrificial or dummy gate(s) (often a poly-silicon gate) is first formed which will serve as a placeholder for a final (or replacement) gate that will be formed later in the process. Namely, a replacement gate process flow permits dielectric layers to be placed around and in between the dummy gates. The dummy gates can then be removed forming gate trenches (i.e., in the remaining dielectric layers, exposing the channel regions). Replacement gate stacks can be formed in the trenches over the channel regions. With the present process, a fin trim is carried out in the gate trench after removal of the dummy gates, prior to formation of the replacement gate stacks. The fin trim forms u-shaped grooves in the sides of the fins within the gate trench. As a result, u-shaped channels will be produced in the sides of the fins around which the replacement gate stacks are formed.

Figure 1A:
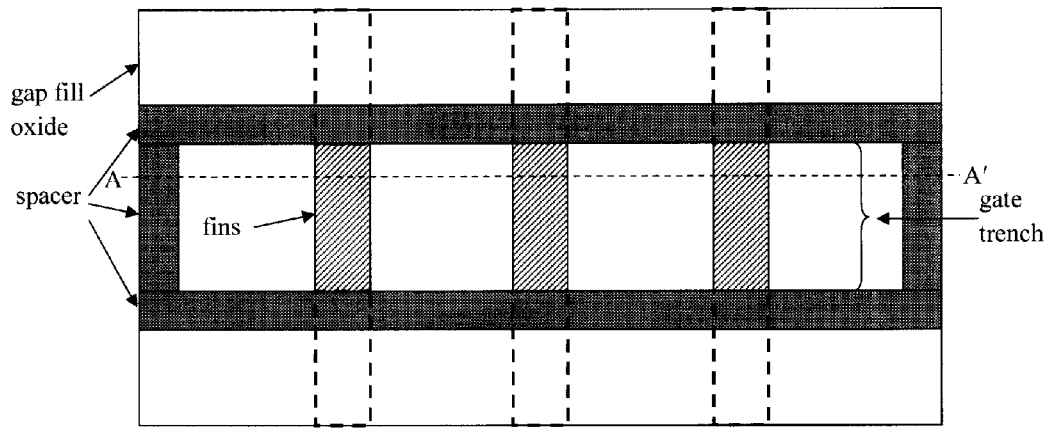
FIG. 1A is a top down view of a fin field effect transistor (FET) device formed using a replacement gate process after dummy gate removal prior to fin trimming within a gate trench of the finFET device according to an embodiment of the present invention.
Figure 1B:
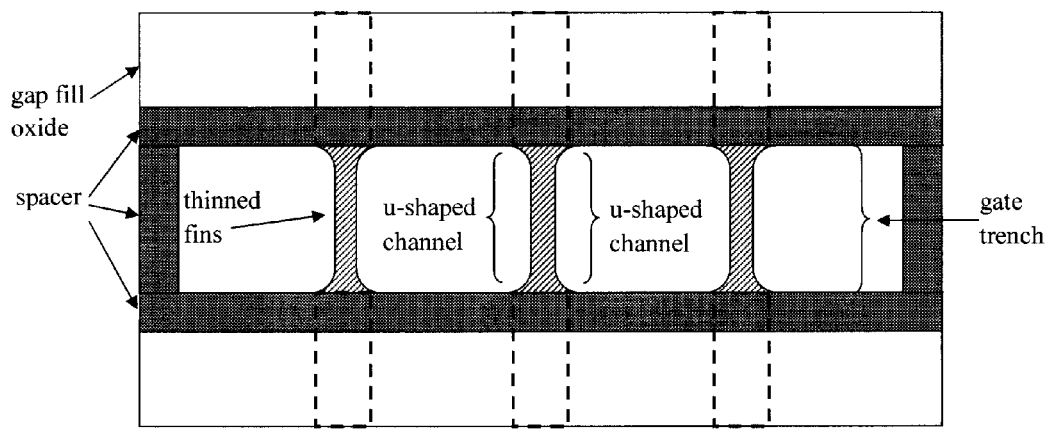
FIG. 1B is a top down view of the finFET device of FIG. 1A following fin trimming within the gate trench according to an embodiment of the present invention.

This concept is further illustrated in FIGS. 1A and 1B which provide top down views of a finFET device. In FIG. 1A, the above-described replacement gate process has been performed up to the removal of the dummy gate (but prior to the formation of the replacement gate stack). As described above, removal of the dummy gates selective to the dielectric layers results in gate trenches being formed in the dielectric layers. It is notable that spacers are often placed on opposite sides of the dummy gates. As shown in FIG. 1A, these spacers will remain lining the gate trench after the dummy gate removal. Dotted lines are used to indicate that the fins continue under the spacers/gap fill oxide. Generally, the portions of the fins that will be eventually covered by the replacement gate stacks will serve as the channels of the finFET device, while portions of the fins adjacent to the replacement gate stacks are the previously fabricated source and drain regions of the finFET device. As shown in FIG. 1A, the as-patterned fins may have a uniform width under the spacers/gap fill oxide and within the trench.

Next, an etch is performed to trim the fins within the gate trench. See FIG. 1B. This fin trim serves to reduce a width of the fins within the gate trench—i.e., such that a width of the fins within the gate trench is less than the width of the fins outside of the gate trench. As will be described in detail below, this fin trimming etch is less effective near the spacers. As a result, the fins (once trimmed) have a u-shaped top-down profile within the gate trench (u-shaped grooves are present in the sides of the fins within the gate trench). This is what forms the u-shaped channels of the present finFET devices. Cross-sectional views, for example, along line A-A' (see FIG. 1A) illustrating the details of the process are presented in the figures and are described below.

In the exemplary embodiment depicted in FIGS. 1A and 1B, source and drain region doping are carried out using standard processes. In an alternative embodiment, the source and drain region doping is carried out through the use of a doped epitaxial "cladding" layer that is formed on the fins prior to the dummy gate. According to that alternative embodiment, a majority of the cladding is removed from the fins within the gate trench during the above-described fin trim. The cladding will remain on the fins under the spacers and gap fill oxide.

Figure 2A:
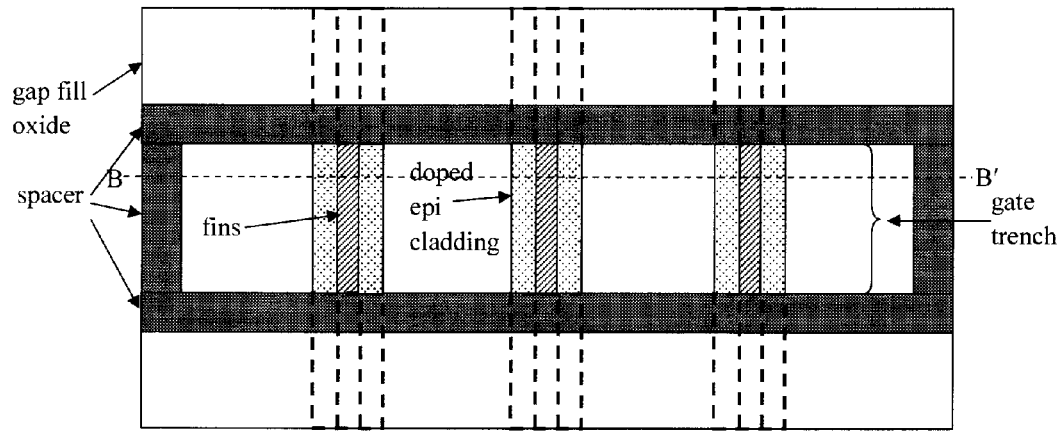
FIG. 2A is a top down view of a finFET device formed using a replacement gate process, and having a doped epitaxial "cladding" layer that is formed on the fins—prior to fin trimming within a gate trench of the finFET device according to an embodiment of the present invention.
Figure 2B:
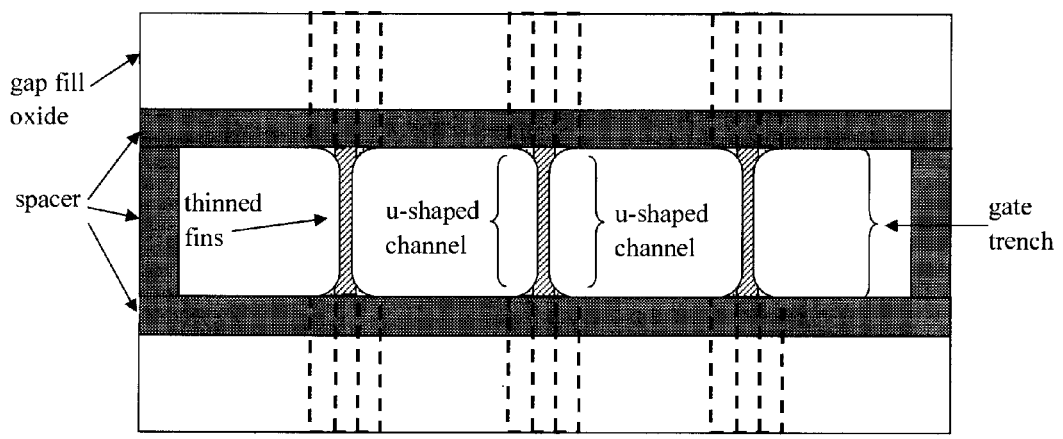
FIG. 2B is a top down view of the finFET device of FIG. 1A following fin trimming within the gate trench (which serves to remove the cladding layer from the fins within the gate trench) according to an embodiment of the present invention.
Figure 3:
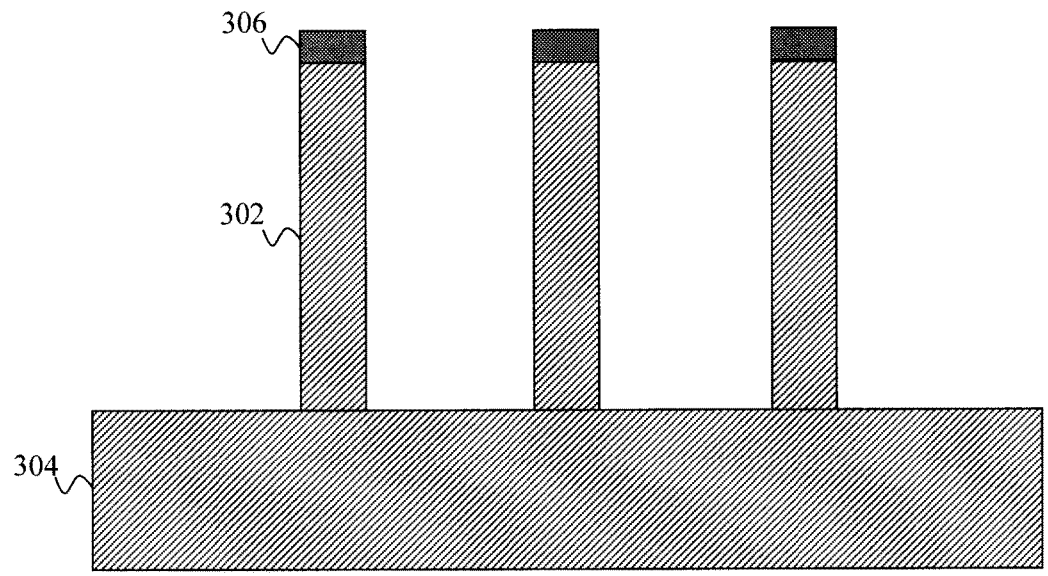
FIG. 3 is a cross-sectional diagram illustrating one or more fins having been patterned in a wafer according to an embodiment of the present invention.

This alternative embodiment is further illustrated in FIGS. 2A and 2B which provide top down views of a finFET device. In FIG. 2A, fins have been patterned and the cladding material has been deposited so as to cover the fins. The above-described replacement gate process has been performed up to the removal of the dummy gate (but prior to the formation of the replacement gate stack). Dotted lines are used to indicate that the cladding covered fins continue under the spacers/gap fill oxide. As shown in FIG. 2A, the as-patterned fins may have a uniform width under the spacers/gap fill oxide and within the trench.

Next, an etch is performed to trim the fins within the gate trench. See FIG. 2B. This fin trim serves to reduce a width of the fins within the gate trench—i.e., such that a width of the fins within the gate trench is less than the width of the fins outside of the gate trench. This fin trimming etch is less effective near the spacers. As a result, the fins (once trimmed) have a u-shaped top-down profile within the gate trench (u-shaped grooves are present in the sides of the fins within the gate trench). This is what forms the u-shaped channels of the present finFET devices. Further, a small portion of the cladding remains on the fins adjacent to the spacers in the gate trench (see FIG. 2B). Cross-sectional views, for example, along line B-B' (see FIG. 1B) illustrating the details of the process are presented in the figures and are described below.

The present techniques will now be described in detail by way of reference to FIGS. 3-23. The exemplary embodiment depicted in FIGS. 1A and 1B (no cladding) will be described first followed by the exemplary embodiment from FIGS. 2A and 2B (cladding). Within each exemplary embodiment, alternative scenarios are presented. For instance, a choice can be made as to when to remove the fin hardmasks. On the one hand, removing the fin hardmasks early in the process can facilitate production since the fin trimming can be performed with a one-step isotropic etch. However, in that case, the fin trim will also undesirably reduce the height of the fins. On the other hand, leaving the fin hardmask in place during the fin trim ensures that the fin height is not affected. Moreover, an anisotropic etch orthogonal to the silicon wafer can be performed to achieve uniform fin thickness within the gate trench. However, additional etching steps may be needed to first trim the hardmask and then trim the fins.

No Cladding/No Hardmask for Fin Trim

In this first exemplary embodiment, in-situ doping of the raised source and drain will be performed, and no hardmask will be employed during the fin trim. As provided above, eliminating the hardmask for the fin trim serves to streamline the process.

The process begins in the same general manner for each of the embodiments described herein. Namely, referring to FIG. 3 one or more fins 302 are first patterned in a wafer 304. While the figures illustrate use of a bulk semiconductor wafer, it would be apparent to one skilled in the art that the present techniques can be implemented in the same manner described starting with a semiconductor-on-insulator (SOI) wafer. With a SOI wafer, a buried oxide (or BOX) separates a SOI layer from an underlying substrate. It is in the SOI layer which the fins are patterned.

Suitable bulk starting semiconductor wafers include, but are not limited to, bulk silicon (Si), germanium (Ge), or silicon germanium (SiGe) wafers or wafers containing these materials. Fins 302 are patterned in the wafer 304 by first patterning a hardmask 306 on the wafer with a footprint and location of the fins. An etch, such as reactive ion etching (RIE), is then used to pattern around the hardmask 306— forming the fins 302 in the wafer. One skilled in the art would be able to control the etch so as to produce fins of a desired height.

Figure 4:
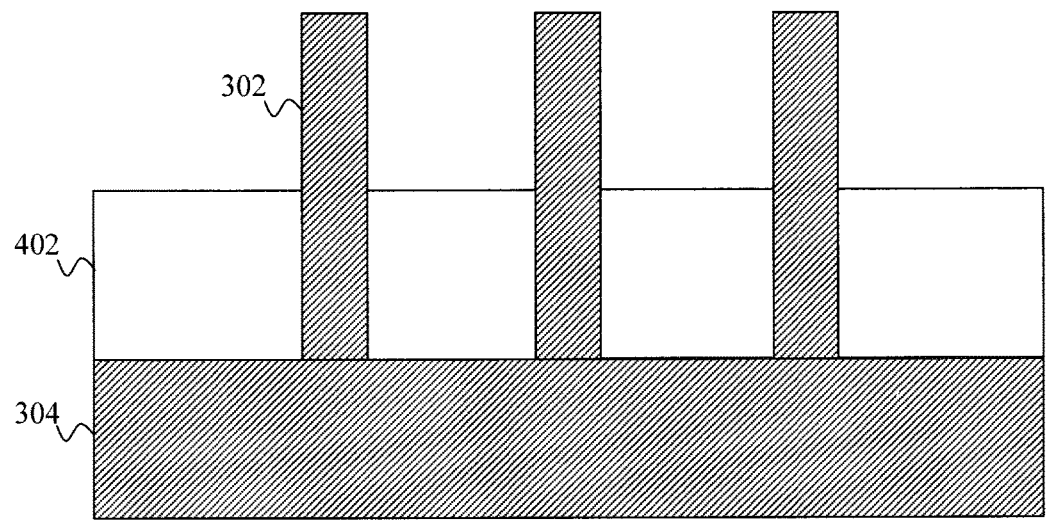
FIG. 4 is a cross-sectional diagram illustrating a shallow trench isolation (STI) oxide having been deposited between the fins and then recessed/etched back to (partially) expose the fins according to an embodiment of the present invention.

In this example, the fin hardmask is removed following the fin etch. See FIG. 4. Since a bulk semiconductor wafer is employed in the particular example depicted in the figures, a shallow trench isolation (STI) oxide is next deposited between the fins. By way of example only, an STI oxide (such as silicon dioxide ($SiO_2$)) is first deposited onto the wafer, filling the spaces between the fins 302, and planarized. The STI oxide is then recessed/etched back (using, for example, an oxide-selective RIE) to (partially) expose the fins 302 as shown in FIG. 4 to form STI oxide 402. If the starting wafer was an SOI wafer, then the STI deposition and etch back would not be necessary since the BOX would already be present below the fins.

As highlighted above, a replacement gate process will be employed in the present process flow. The replacement gate process involves first forming one or more dummy gates over the fins. The dummy gates will serve as placeholders for subsequently placed replacement gates. It is during the replacement gate process that the present fin trimming is performed.

Figure 5:
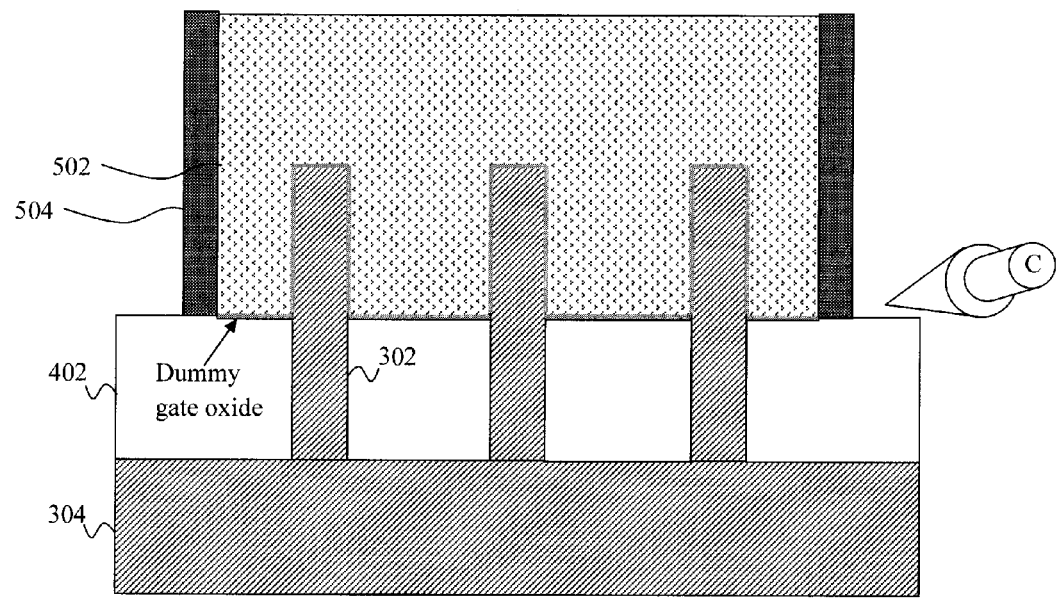
FIG. 5 is a cross-sectional diagram illustrating a dummy gate(s) having been formed over the fins and spacers having been formed on opposite sides of the dummy gates according to an embodiment of the present invention.

Referring to FIG. 5, the replacement gate process begins with the formation of a dummy gate(s) 502 over the fins 302 (i.e., over portions of the fins 302 that will serve as a channel region(s) of the finFET device). Prior to forming the dummy gates, a dummy gate oxide (e.g., $SiO_2$) is preferably first deposited/formed on the fins. The dummy gate oxide will act as a stopping layer and protect the fins 302 when the dummy gate(s) are removed later in the process. According to an exemplary embodiment, the dummy gate oxide is deposited on the fins to a thickness of from about 2 nanometers (nm) to about 4 nm, and ranges therebetween.

A layer of poly-silicon (poly-Si) is then deposited over the dummy gate oxide (using, e.g., a chemical vapor deposition (CVD) process, such as low pressure CVD (LPCVD)). Standard lithography and etching can then be used to pattern the poly-Si into one or more of the dummy gates 502. By way of example only, a dummy gate hardmask (not shown) can be patterned on the poly-Si with the footprint and location of the dummy gates 502, and a poly-Si-selective RIE used to pattern the poly-Si layer (via the dummy gate hardmasks) into the dummy gates 502. It is notable that patterning of the dummy gate oxide is not required. However, in practice the dummy gate oxide can be removed during the post dummy-gate-etch wet cleans (with, e.g., hydrofluoric acid (HF)).

Figure 6:
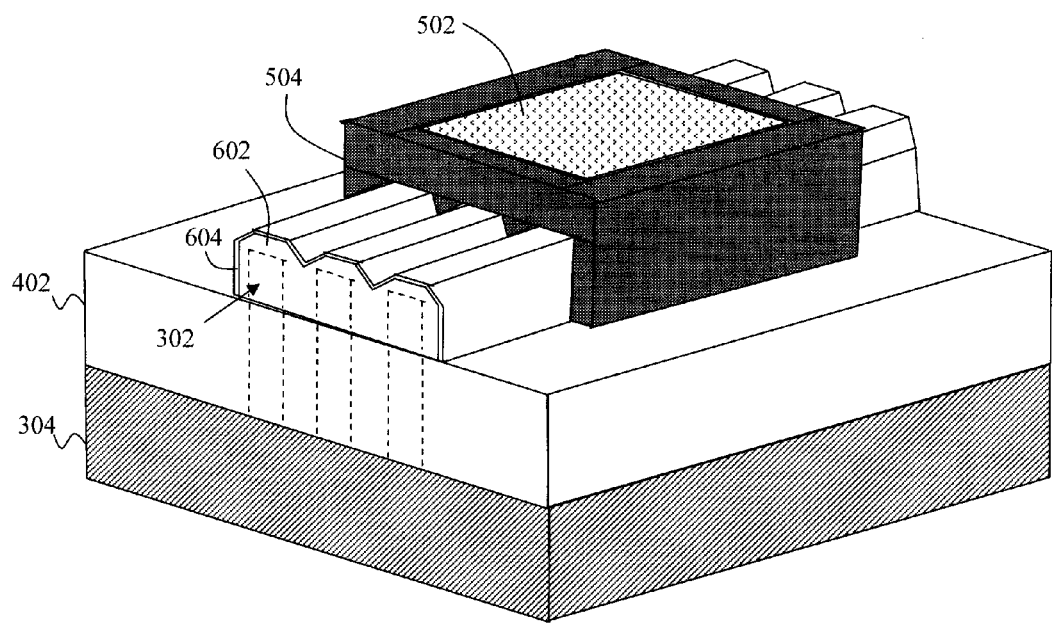
FIG. 6 is a three-dimensional diagram illustrating doped source and drain regions of the finFET device having been formed according to an embodiment of the present invention.

Next, spacers 504 are formed on opposite sides of the dummy gates 502. See FIG. 5. The spacers 504 will be formed on all sides of the dummy gates 502 and thus will line the gate trench formed by removal of the dummy gates (see FIG. 1A). The spacers will serve to offset the gate from what will be the source and drain regions of the device. Namely, at this point in the process, doped source and drain regions can be formed. According to an exemplary embodiment, the doped source and drain regions are formed by an epitaxial growth process whereby an in-situ doped epitaxial semiconductor material (e.g., epitaxial Si, Ge, or SiGe) 602 is formed on the exposed portions of the fins (i.e., those portions of the fins not covered by spacer or dummy gate). See FIG. 6. By way of example only, suitable n-type dopants include but are not limited to phosphorous (P), and suitable p-type dopants include but are not limited to boron (B). A three-dimensional view (e.g., from viewpoint C—see FIG. 5) is provided in FIG. 6 to best depict the source and drain regions. As provided above, those portions of the fins adjacent to the replacement gate stacks will serve as source and drain regions of the finFET device. The amount of the epitaxial material 602 grown on the fins can be controlled so that each of the fins remains distinct or, as shown in FIG. 6, are (optionally) merged by the epitaxial material 602. A standard silicidation process may optionally be performed to form source and drain contacts 604, e.g., wherein a silicide metal (such as nickel (Ni)) is deposited and an anneal is performed to form the silicide. The silicide contacts will form only where the silicide metal is in contact with a semiconductor—such as the source/drain epitaxial material 602.

Figure 7:
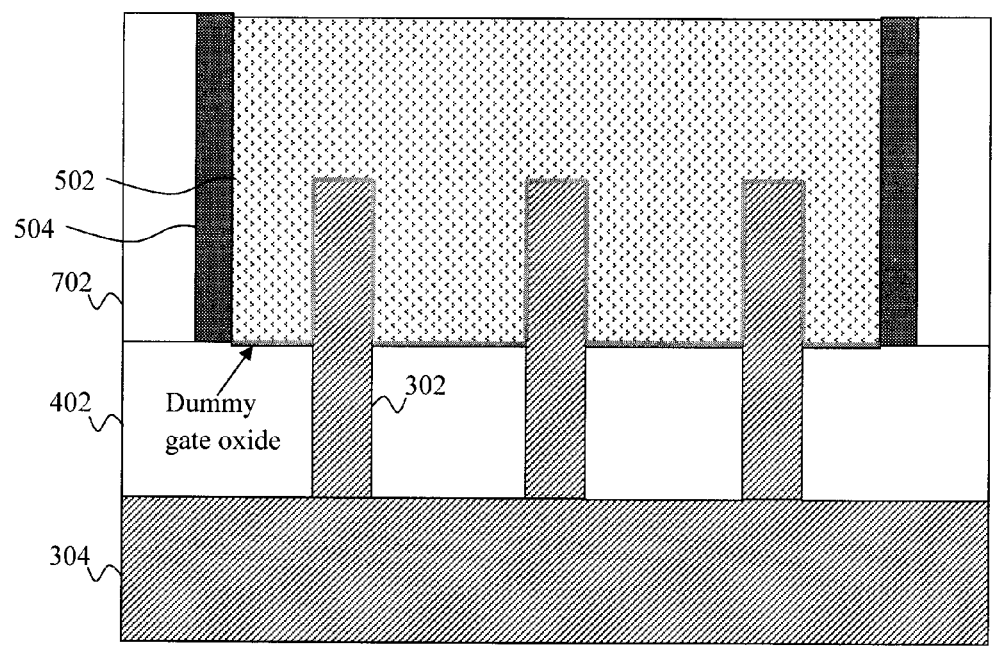
FIG. 7 is a cross-sectional diagram illustrating a gap fill oxide having been deposited on the wafer, filling any gaps outside of the spacers according to an embodiment of the present invention.
Figure 8:
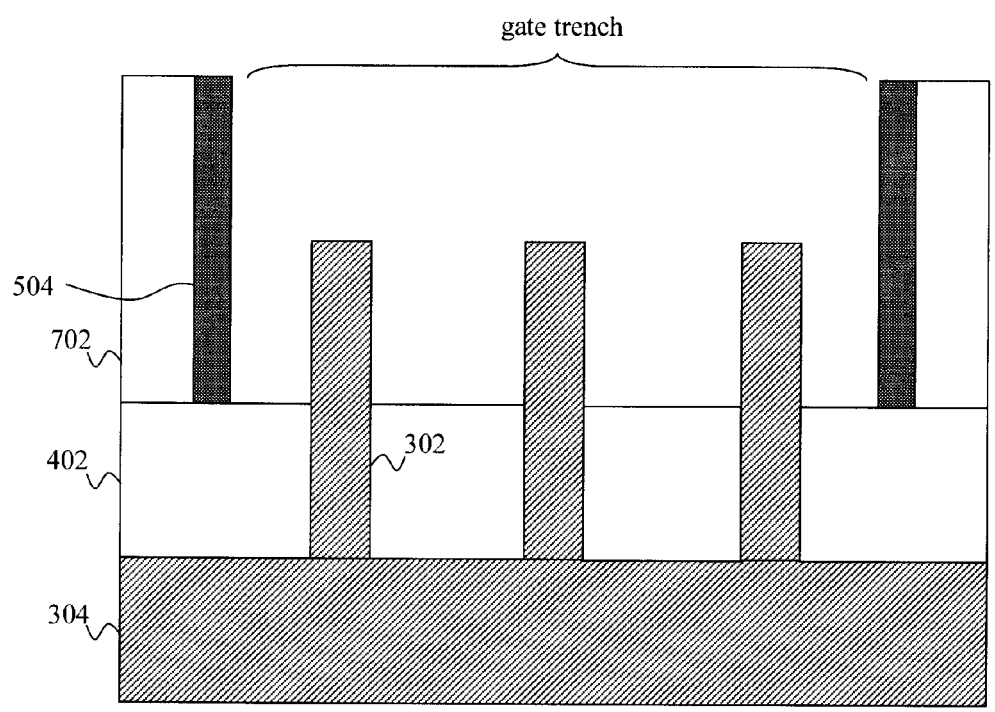
FIG. 8 is a cross-sectional diagram illustrating the dummy gates having been removed selective to gap fill oxide/spacers—forming gate trenches which are lined by the spacers according to an embodiment of the present invention.
Figure 9:
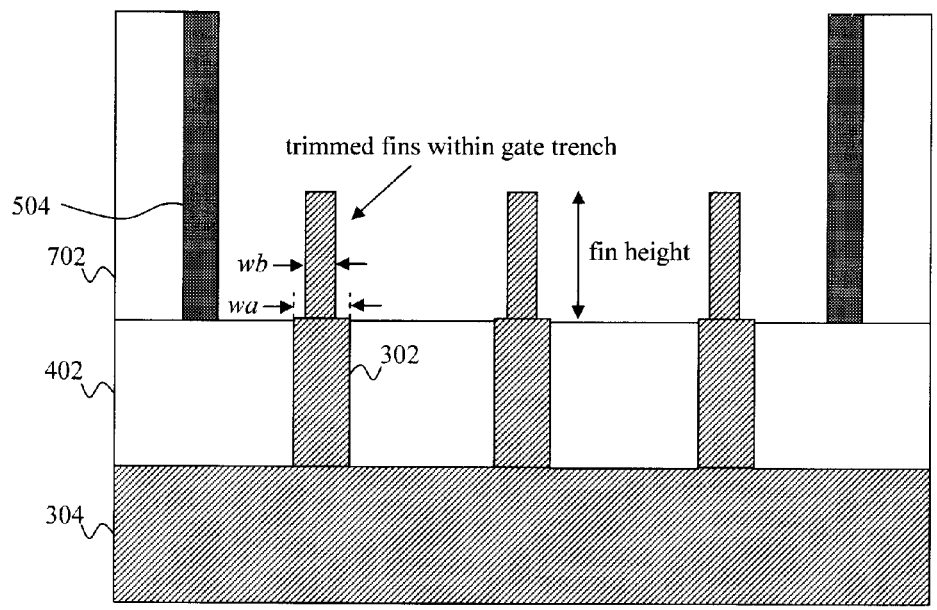
FIG. 9 is a cross-sectional diagram illustrating the fins having been trimmed within the gate trench according to an embodiment of the present invention.
Figure 10:
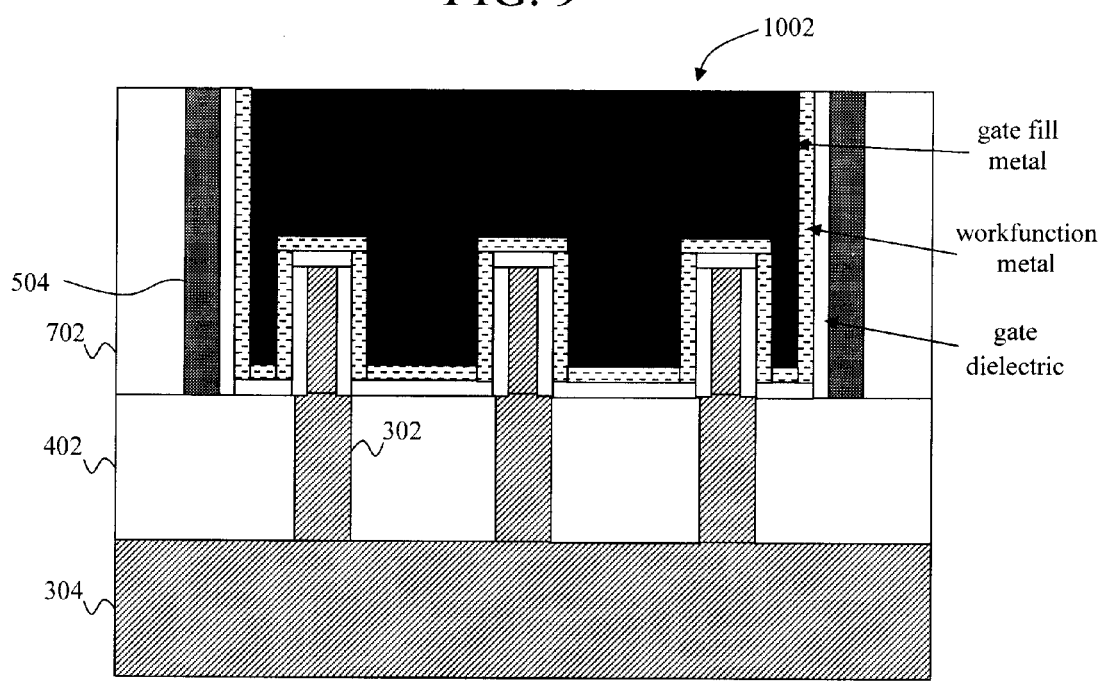
FIG. 10 is a cross-sectional diagram illustrating replacement gate stacks having been formed in the gate trenches over the portions of the fins that will serve as the channel regions of the finFET device according to an embodiment of the present invention.

Switching back to a cross-sectional view (i.e., along line A-A' (see FIG. 1A)), as shown in FIG. 7 a gap fill oxide 702 is then deposited on the wafer, filling any gaps between the spacers. As highlighted above, removal of the dummy gates 502 selective to the gap fill oxide 702 forms the gate trenches lined with spacers 504. Namely, as shown in FIG. 8, the dummy gates 502 are removed selective to gap fill oxide 702/spacers 504—forming gate trenches which are lined by the spacers 504. See also FIG. 1A—described above. According to an exemplary embodiment, the dummy gates 502 are removed using a wet chemical etching or dry etching process. As provided above, the dummy gate oxide acts as a stopping layer during this dummy gate removal etch. The dummy gate oxide can then be removed using an oxide selective etching process.

The fins are then trimmed within the gate trench. See FIG. 9. This fin trim serves to reduce the width of the fins within the gate trench, thereby forming the present u-shaped channels (see also FIG. 1B—described above). By way of example only, the fins have a starting width wa of from about 7 nm to about 20 nm, and ranges therebetween, and a reduced width after the fin trim wb of from about 3 nm to about 10 nm, and ranges therebetween. It is notable that only the portions of the fins exposed within the gate trench are trimmed in this step. Thus, the portions of the fins covered by a spacer or gap fill oxide are not affected by the trimming and thus remain at the starting width wa. Further, as provided above, the fin trimming etch may be less effective near the spacers. Thus, the fins (once trimmed) have a u-shaped top-down profile within the gate trench. See FIG. 1B—described above.

According to an exemplary embodiment, the fin trim is performed using an isotropic plasma etching process which will affect only the exposed fins. As noted above, a side effect of this fin trim is that a height of the fins is also reduced. Compare for example FIG. 8 and FIG. 9. An alternative embodiment will be presented below in which the fin hardmask is left in place during the fin trim which prevents vertical etching of the fins and allows an anisotropic vertical etch to be used to remove some or all of the taper.

Alternatively, the fin trim may be carried out using an isotropic wet etching process, or an oxidation/oxide strip process. For instance, the fins within the gate trench can be oxidized (e.g., using a thermal oxidation process) and the oxide stripped to trim the fins. This oxidation/oxide strip process can be repeated multiple times until a desired fin width is achieved (see above exemplary fin width values).

To complete the replacement gate process, following the fin trim, replacement gate stacks 1002 are formed in the gate trenches over the portions of the fins 302 that will serve as the channel regions of the finFET device. See FIG. 10. The replacement gate stacks will cover the trimmed portions of the fins (i.e., a width of the fins under the replacement gate stacks is less than the width of the fins outside of the replacement gate stacks).

According to an exemplary embodiment, the gate stacks 1002 include a conformal gate dielectric, a conformal workfunction setting metal, and a (low resistance) filler metal. By way of example only, the gate stacks 1002 are formed by first using a conformal deposition process to deposit a gate dielectric material into and lining the gate trenches and covering the fins 302. Suitable conformal deposition processes include, but are not limited to, chemical vapor deposition (CVD) or atomic layer deposition (ALD). According to an exemplary embodiment, the gate dielectric is a high-$\kappa$ material such as hafnium oxide ($HfO_2$) or lanthanum oxide ($La_2O_3$). The term "high-$\kappa$" as used herein refers to a material having a relative dielectric constant $\kappa$ which is much higher than that of silicon dioxide (e.g., a dielectric constant $\kappa$=25 for $HfO_2$ rather than 4 for silicon dioxide). Next, a conformal workfunction setting metal layer is deposited (e.g., using CVD or ALD) into the trench on the gate dielectric. The particular workfunction metal employed can vary depending on whether an n-type or p-type transistor is desired. Suitable n-type workfunction metals include, but are not limited to, titanium nitride (TiN), tantalum nitride (TaN), and aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and tantalum aluminum carbide (TaAlC). Suitable p-type workfunction metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above. Finally a low resistance gate metal (i.e., a filler gate metal) is deposited into the trenches, filling the trenches. Suitable low resistance gate metals include, but are not limited to tungsten (W) or aluminum (Al).

As provided above, several variants of the present techniques are contemplated herein. For instance, an alternative embodiment is now presented where a hardmask is used during the fin trim to prevent loss of fin height during the fin trim etch. It is notable that the same general processing steps are employed as in the above-described embodiment. Thus, only those steps which differ are illustrated in the figures and described below. Reference will be made to cross-sectional views, for example, along line A-A' (see FIG. 1A).

No Cladding/Hardmask Used During Fin Trim

In this second exemplary embodiment, in-situ doping of the source and drain will be performed as in the first embodiment, and a hardmask will be employed during the fin trim.

Figure 11:
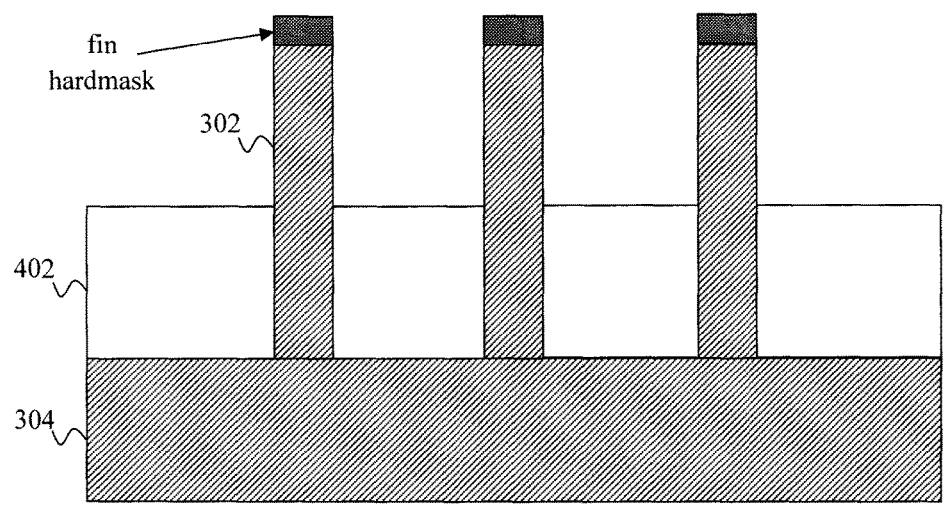
FIG. 11 is a cross-sectional diagram illustrating, according to an alternative embodiment, one or more fins with hardmask having been patterned in a wafer and an STI oxide having been deposited between the fins and then recessed/etched back to (partially) expose the fins according to an embodiment of the present invention.

Referring to FIG. 11, the process begins in the same general manner as above, wherein one or more fins 302 are first patterned in a wafer 304. Fins 302 are patterned in the wafer 304 by first patterning a hardmask 306 on the wafer with a footprint and location of the fins. An etch, such as RIE, is then used to pattern around the hardmask 306—forming the fins 302 in the wafer. It is notable that while the fins 302 are shown in the figures to have perfectly vertical sidewalls, it may in fact be desirable to employ fins having tapered sidewalls (where the width of the fins at their base is greater than at the top of the fins). This configuration provides some notable benefits during the source drain epitaxy. For example, a) the dummy gate etch is easier because stringers can be cleared from the sides of the fins more easily with a purely anisotropic etch; b) spacer formation is easier as well for the same reason; and c) cleaner removal of the spacers gives better epi. In that case, the fin trim (described below) below the trimmed fins hardmask can be performed to straighten the fin sidewalls—and thereby trim the fins. In this example, the fin hardmask is left in place following the fin etch. As above, an STI oxide 402 is next deposited between the fins and then recessed/etched back to (partially) expose the fins 302.

Figure 12:
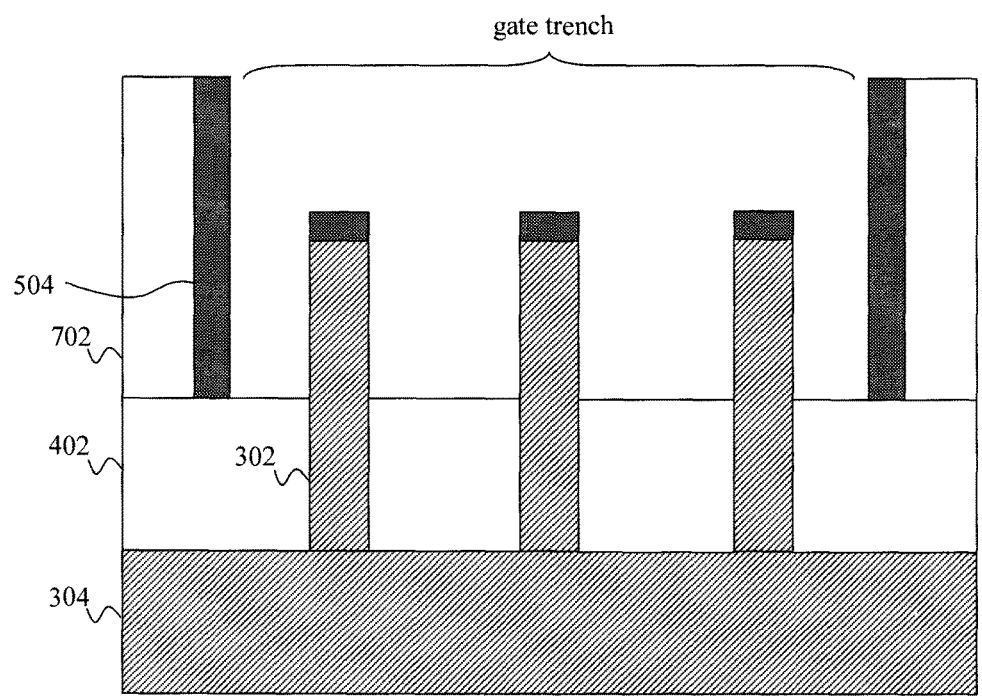
FIG. 12 is a cross-sectional diagram illustrating a dummy gate process having been used to form gate trenches which are lined by spacers according to an embodiment of the present invention.

As shown in FIG. 12, the same dummy gate process as described above is then used to form gate trenches. As above, spacers 504 are present lining the gate trenches. What is depicted in FIG. 12 is the structure following the dummy gate removal. For detailed depictions of the dummy gate, spacer, and gap fill oxide placement, and dummy gate removal processes, see for example, FIGS. 5-8—described above. Details regarding the source/drain epitaxy which may be performed in the same manner as described above were provided in FIG. 6.

Figure 13:
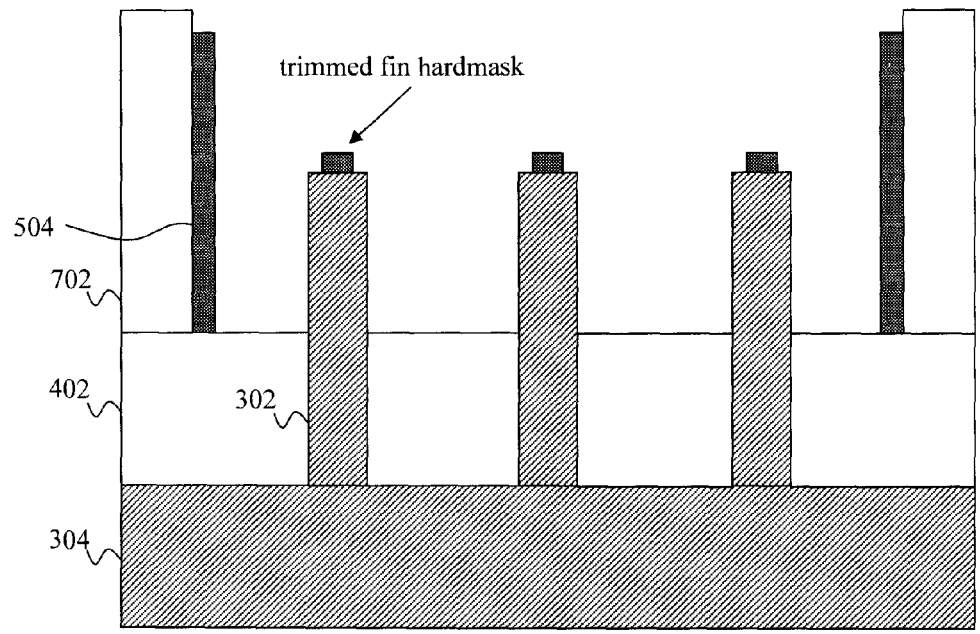
FIG. 13 is a cross-sectional diagram illustrating fin hardmasks having been trimmed in order to permit trimming of the underlying fins according to an embodiment of the present invention.
Figure 14:
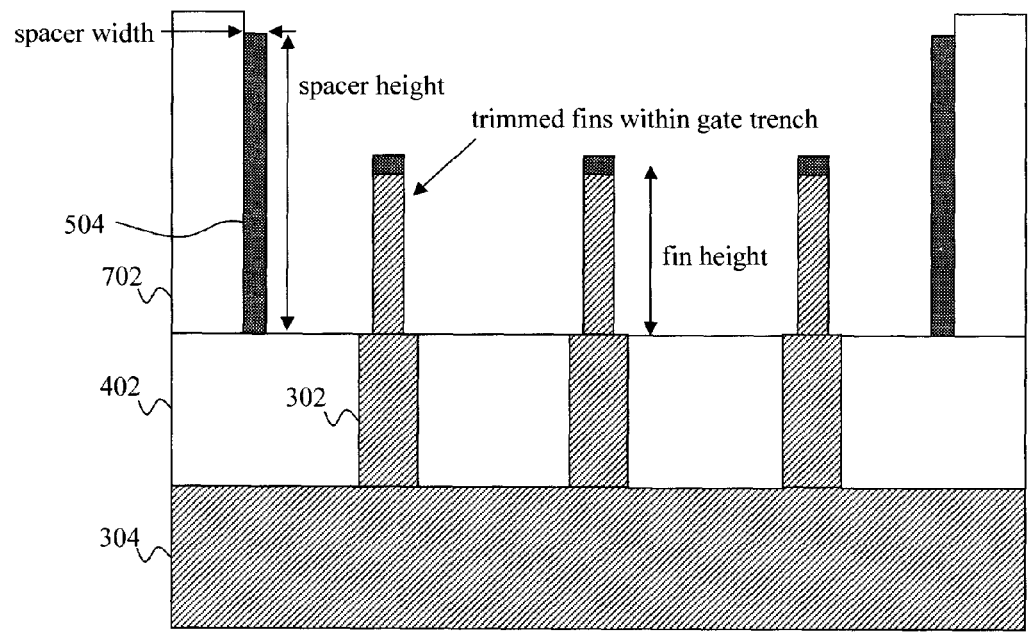
FIG. 14 is a cross-sectional diagram illustrating the fins within the gate trench having been trimmed beneath the trimmed fin hardmasks according to an embodiment of the present invention.
Figure 15:
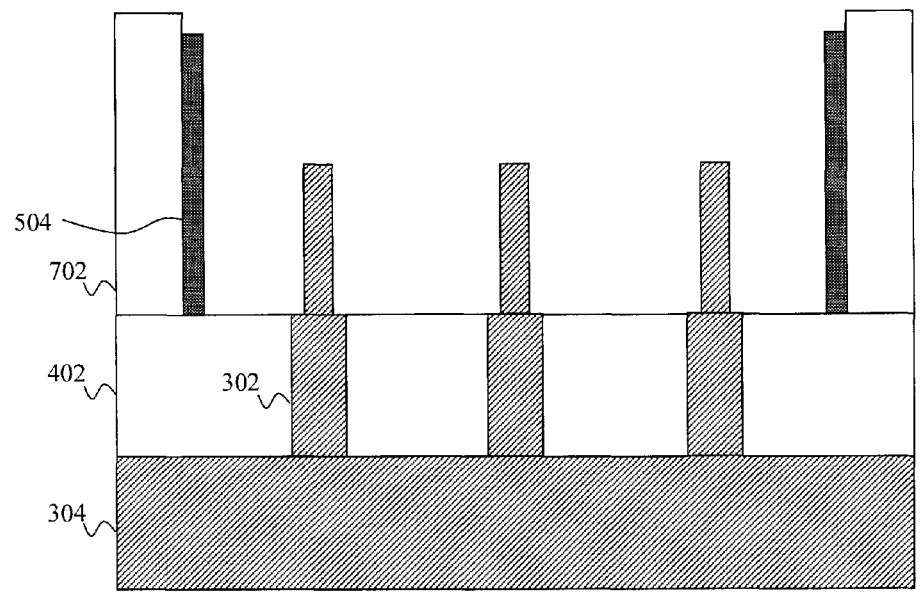
FIG. 15 is a cross-sectional diagram illustrating the fin hardmasks having been removed according to an embodiment of the present invention.

The fin trimming process is depicted in FIGS. 13 and 14. Namely, as shown in FIG. 13, the fin hardmasks (which, as described above, are left in place following the fin etch) first may be thinned in order to permit more trimming of the underlying fins by an anisotropic vertical etch such as RIE selective to the hardmask. The fin hardmask trim can be carried out using an isotropic etching process. As shown in FIG. 13, depending on the composition of the fin hardmasks and the spacers 504, the fin hardmask trim may also etch the spacers 504, reducing the height and/or width of the spacers 504. This would occur, for instance, when nitride spacers and nitride fin hardmasks are employed.

Figure 16:
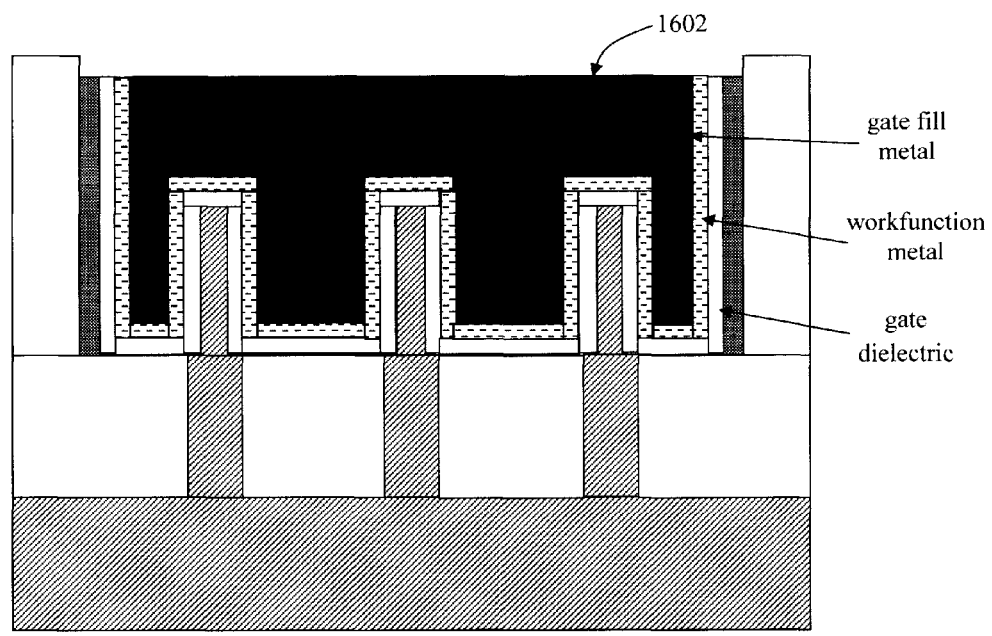
FIG. 16 is a cross-sectional diagram illustrating replacement gate stacks having been formed in the gate trenches according to an embodiment of the present invention.

Next, as shown in FIG. 14, the fins 302 within the gate trench are trimmed beneath the (now trimmed) fin hardmasks using the anisotropic vertical RIE etch. At this point, the fin in the channel region may have straight vertical sidewalls of equal width as the trimmed hardmask. The same above-described isotropic or oxidation/oxide strip processes may then be employed to further recess the channel regions if desired. Following the fin trim, the fin hardmasks are removed. See FIG. 15. The replacement gate stack formation process can then be carried out in the same manner as described above to form replacement gate stacks 1602 in the gate trenches. See FIG. 16. As shown in FIG. 16, each replacement gate stack 1602 includes a conformal gate dielectric, a conformal workfunction setting metal, and a (low resistance) filler metal. Suitable gate dielectrics, workfunction setting metals, and (low resistance) filler metals were provided above.

As provided above, in an alternative embodiment the source and drain region doping is carried out through the use of a doped epitaxial "cladding" layer that is formed on the fins prior to the dummy gate. This cladding embodiment is now described in detail. It is notable that the same variants as above, i.e., fin trim with or without the fin hardmask in place, can also be implemented in accordance with the cladding-based embodiments. Again, the same general processing steps are employed as in the above-described embodiments. Thus, only those steps which differ are illustrated in the figures and described below. Reference will be made to cross-sectional views, for example, along line B-B' (see FIG. 2A).

Cladding/No Hardmask Used During Fin Trim

In this exemplary embodiment, source and drain doping will be provided by way of a doped epitaxial cladding layer that will be formed on the fins prior to the dummy gate process (and which will subsequently be substantially removed from the gate trench), and no hardmask is present on the fins during the fin trim—thus streamlining the process.

Figure 17:
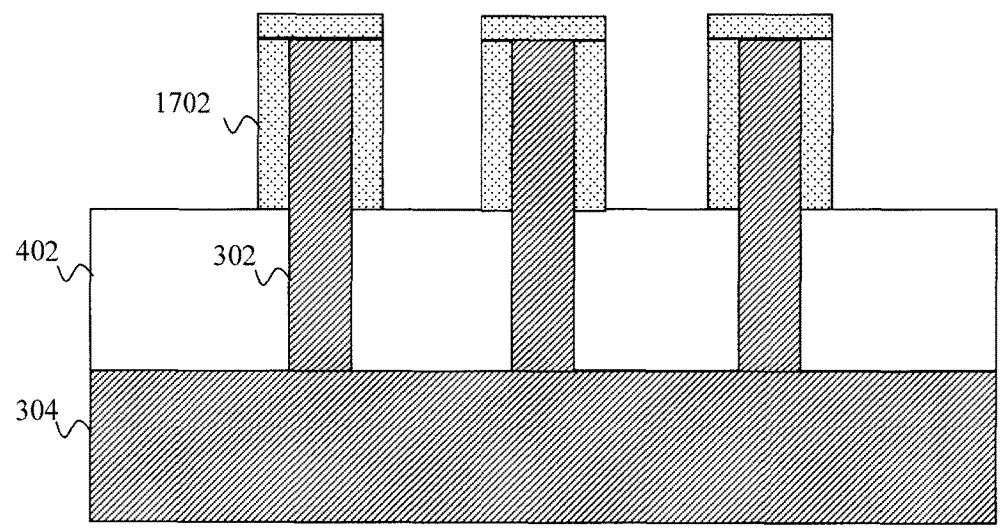
FIG. 17 is a cross-sectional diagram illustrating, according to another alternative embodiment, one or more fins having been patterned in a wafer and an STI oxide having been deposited between the fins and then recessed/etched back to (partially) expose the fins, and a doped epitaxial cladding layer having been formed on the exposed surfaces of the fins according to an embodiment of the present invention.

Referring to FIG. 17, the process begins in the same general manner as above, wherein one or more fins 302 are first patterned in a wafer 304. Fins 302 are patterned in the wafer 304 by first patterning a hardmask 306 on the wafer with a footprint and location of the fins. An etch, such as RIE, is then used to pattern around the hardmask 306—forming the fins 302 in the wafer. In this example, the fin hardmask is removed following the fin etch. As above, an STI oxide 402 is next deposited between the fins and then recessed/etched back to (partially) expose the fins 302.

A doped epitaxial cladding layer 1702 is next formed on the exposed surfaces of the fins. According to an exemplary embodiment, doped epitaxial cladding layer 1702 is formed from Si, Ge, or SiGe. Advantageously, an epitaxial cladding layer 1702 permits in-situ doping of the cladding layer during growth thereby providing enhanced control over doping uniformity, concentration, etc. This enhanced control over the doping process is especially advantageous in scaled devices with a tight pitch which make traditional doping implantation techniques difficult. As provided above, suitable n-type dopants include but are not limited to phosphorous (P), and suitable p-type dopants include but are not limited to boron (B). Alternatively doping of the cladding layer can be performed ex-situ using standard implantation techniques. The doped epitaxial cladding layer 1702 should be as thin as possible (e.g., the doped epitaxial cladding layer 1702 may have a thickness of less than or equal to about 3 nm) to reduce the overlap region with the subsequently formed replacement gate stacks, thereby reducing the gate to source or drain overlap capacitance. However, the doped epitaxial cladding layer 1702 should be as thick as needed to provide adequate conductance between the edge of the gate stacks and the raised source and drain contact regions (see above) that may be introduced outside of the spacers. The doped epitaxial cladding layer 1702 will, at present, cover all exposed surfaces of the as-patterned fins 302 (see, for example, FIG. 2B). The doped epitaxial cladding layer 1702 will subsequently be substantially removed from portions of the fins 302 within the gate trench.

Figure 18:
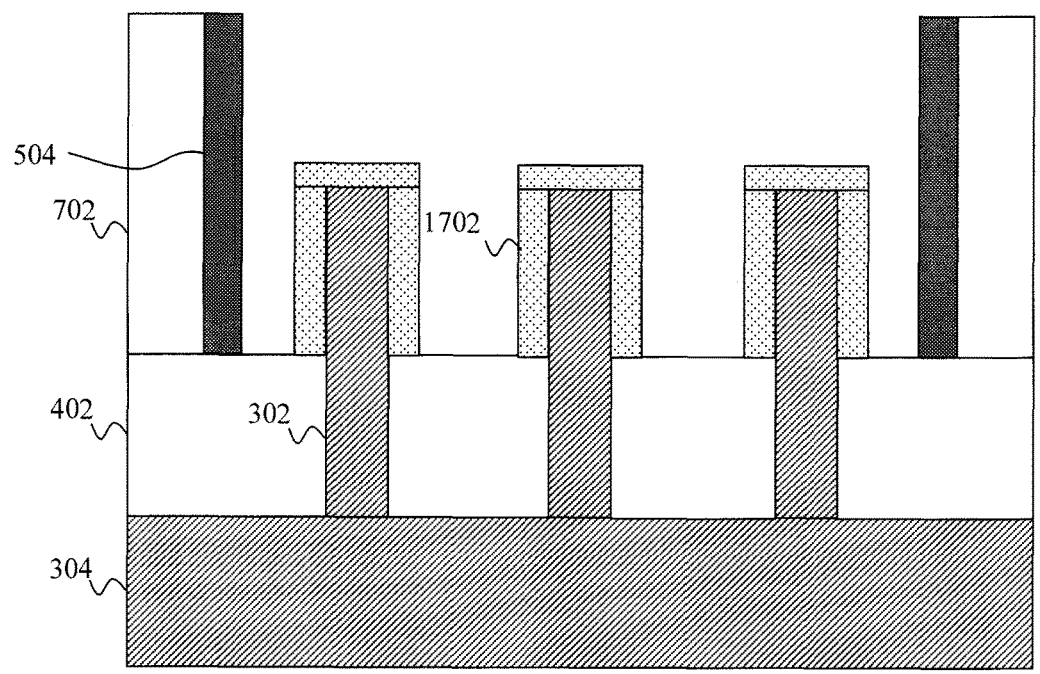
FIG. 18 is a cross-sectional diagram illustrating a dummy gate process having been used to form gate trenches in a gap fill oxide according to an embodiment of the present invention.

As shown in FIG. 18, the same dummy gate process as described above is then used to form gate trenches. As above, spacers 504 are present lining the gate trenches. What is depicted in FIG. 18 is the structure following the dummy gate removal. For detailed depictions of the dummy gate, spacer, and gap fill oxide placement, and dummy gate removal processes, see for example, FIGS. 5, 7, and 8—described above. Here, however, source and drain doping is achieved via the doped epitaxial cladding layer 1702 which is placed on the fins prior to the dummy gates. Accordingly, the dummy gates are placed over the doped epitaxial cladding layer 1702. Following removal of the dummy gates, the doped epitaxial cladding layer 1702 remains present on the fins. However, as shown in FIG. 19, the doped epitaxial cladding layer 1702 is removed from the fins within the gate trench during the fins trim.

Figure 19:
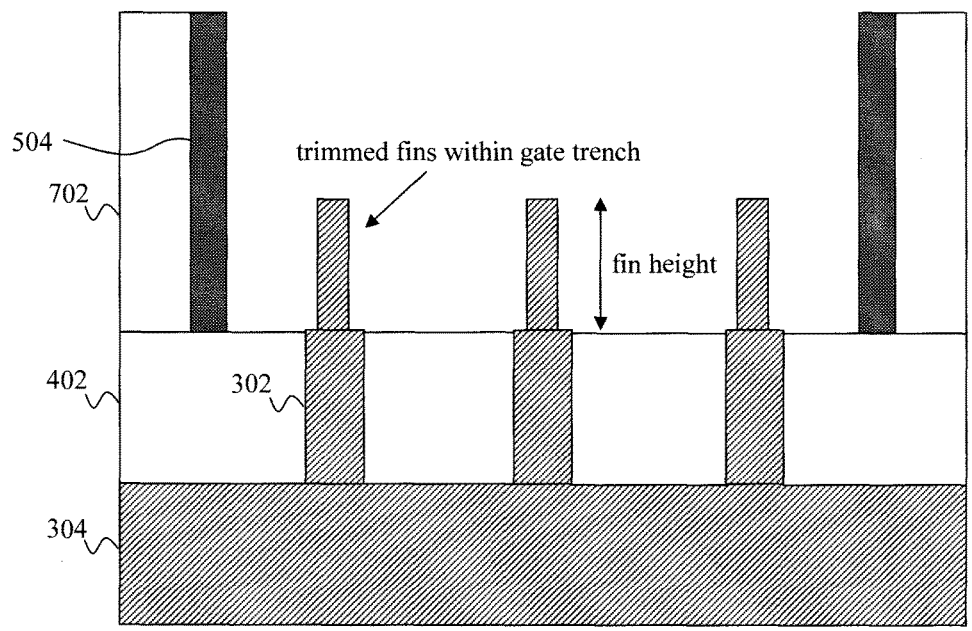
FIG. 19 is a cross-sectional diagram illustrating the fins are trimmed within the gate trench (during which the doped epitaxial cladding layer is removed from the fins within the gate trench) according to an embodiment of the present invention.

Namely, as shown in FIG. 19, the fins 302 are trimmed within the gate trench. As provided above, the cladding is the same (or a very similar) material as the fins, just with doping. Doping generally only enhances etch rate, so the same etch can be used to remove the cladding and etch the fins within the gate trench. However, one could employ selectively etchable materials, such as a SiGe epitaxial cladding on Si fins, and then use a selective SiGe etch to remove the cladding from the fins in the gate trench— followed by trimming of the fins within the gate trench. The same above-described isotropic or oxidation/oxide strip processes may be employed. Exemplary starting and ending (trimmed) fin width values were provided above. As noted above, a side effect of this fin trim is that a height of the fins is also reduced.

The replacement gate stack formation process can then be carried out in the same manner as described above. The finFET device structure with the replacement gate stack would appear as shown illustrated in FIG. 10—described above.

Another exemplary embodiment is now described having the doped epitaxial "cladding" layer where a hardmask is used during the fin trim. It is notable that the same general processing steps are employed as in the above-described embodiment. Thus, only those steps which differ are illustrated in the figures and described below. Reference will be made to cross-sectional views, for example, along line B-B' (see FIG. 2A).

Cladding/Hardmask Used During Fin Trim

In this exemplary embodiment, source and drain doping will be provided by way of a doped epitaxial cladding layer that will be formed on the fins prior to the dummy gate process (and which will subsequently be substantially removed from the gate trench), and a hardmask will be employed during the fin trim.

The process begins in the same general manner as above, wherein one or more fins 302 are first patterned in a wafer 304. Fins 302 are patterned in the wafer 304 by first patterning a hardmask 306 on the wafer with a footprint and location of the fins. An etch, such as RIE, is then used to pattern around the hardmask 306—forming the fins 302 in the wafer. In this example, the fin hardmask is left in place following the fin etch. As above, an STI oxide 402 is next deposited between the fins and then recessed/etched back to (partially) expose the fins 302.

Figure 20:
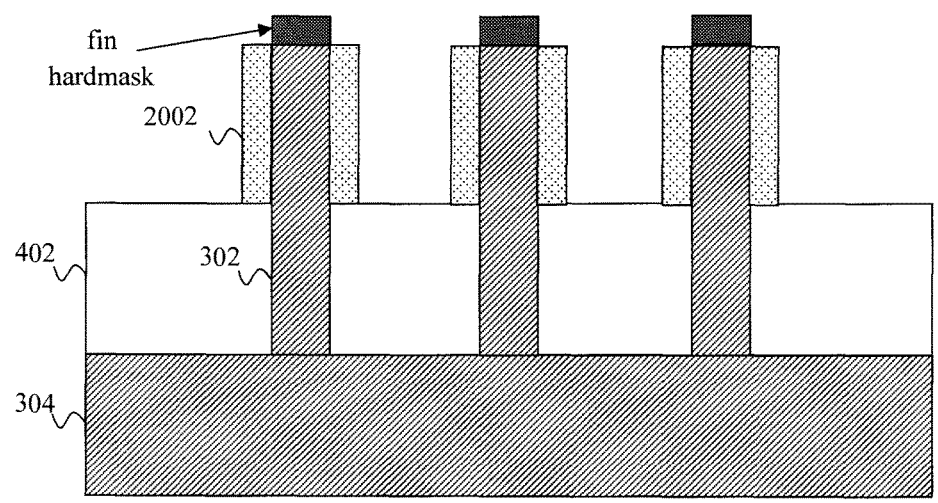
FIG. 20 is a cross-sectional diagram illustrating, according to yet another alternative embodiment, one or more fins having been patterned in a wafer and an STI oxide having been deposited between the fins and then recessed/etched back to (partially) expose the fins, and a doped epitaxial cladding layer having been formed on the exposed surfaces of the fins according to an embodiment of the present invention.

Referring to FIG. 20, a doped epitaxial cladding layer 2002 is next formed on the exposed surfaces of the fins. According to an exemplary embodiment, doped epitaxial cladding layer 2002 is formed from Si, Ge, or SiGe, e.g., to a thickness of less than or equal to about 3 nm. The doped epitaxial cladding layer 2002 will, at present, cover all exposed surfaces of the as-patterned fins 302 (see, for example, FIG. 2A). The doped epitaxial cladding layer 2002 will subsequently be substantially removed from portions of the fins 302 within the gate trench.

Figure 21:
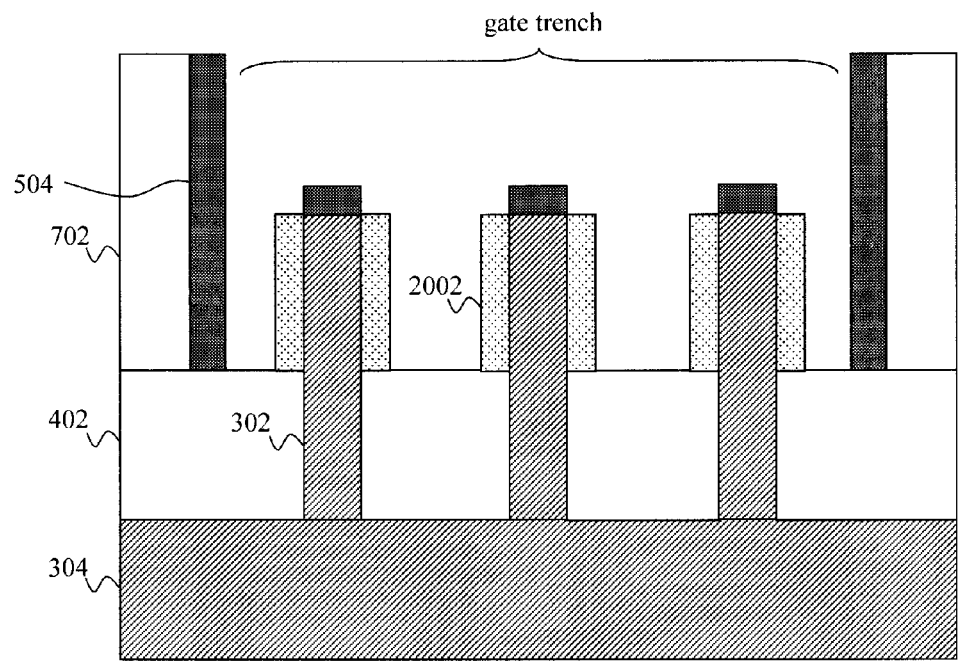
FIG. 21 is a cross-sectional diagram illustrating a dummy gate process having been used to form gate trenches lined with spacers according to an embodiment of the present invention.

As shown in FIG. 21, the same dummy gate process as described above is then used to form gate trenches. As above, spacers 504 are present lining the gate trenches. What is depicted in FIG. 21 is the structure following the dummy gate removal. For detailed depictions of the dummy gate, spacer, and gap fill oxide placement, and dummy gate removal processes, see for example, FIGS. 5, 7, and 8—described above. Here, however, source and drain doping is achieved via the doped epitaxial cladding layer 2002 which is placed on the fins prior to the dummy gates. Accordingly, the dummy gates are placed over the doped epitaxial cladding layer 2002. Following removal of the dummy gates, the doped epitaxial cladding layer 2002 remains present on the fins.

Figure 22:
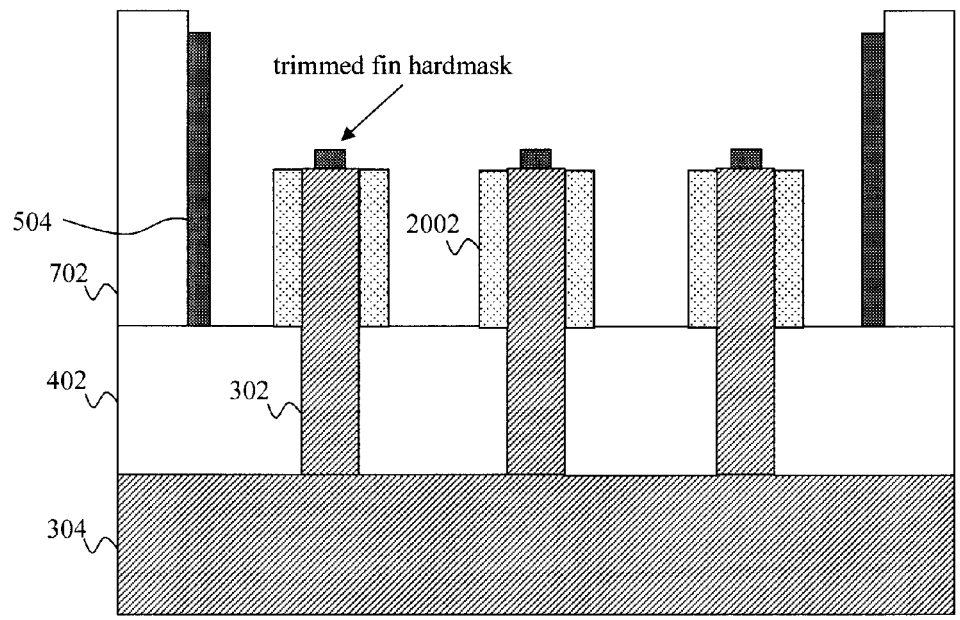
FIG. 22 is a cross-sectional diagram illustrating fin hardmasks having been trimmed in order to permit trimming of the underlying fins according to an embodiment of the present invention.
Figure 23:
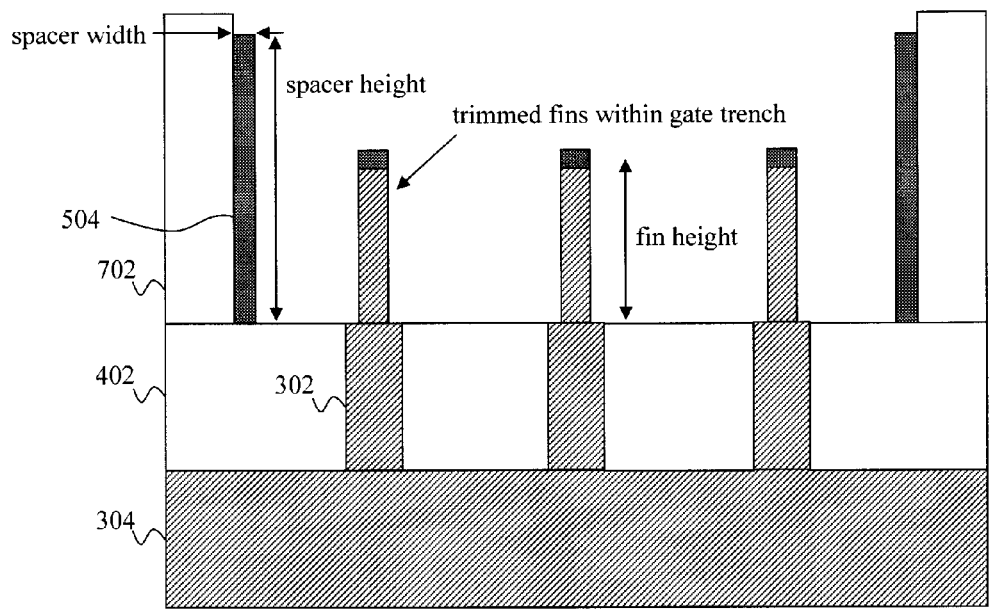
FIG. 23 is a cross-sectional diagram illustrating fin hardmasks and the fins having been trimmed within the gate trench according to an embodiment of the present invention.

The fin trimming process is depicted in FIGS. 22 and 23. Namely, as shown in FIG. 22, the fin hardmasks (which, as described above, are left in place following the fin etch) first may be trimmed in order to permit the desired trimming of the underlying fins. The fin hardmask trim can be carried out using an isotropic etching process. As shown in FIG. 22, depending on the composition of the fin hardmasks and the spacers 504, the fin hardmask trim may also etch the spacers 504, reducing the height and/or width of the spacers 504. This would occur, for instance, when nitride spacers and nitride fin hardmasks are employed.

It is notable that while the fins 302 are shown in the figures to have perfectly vertical sidewalls, it may in fact be desirable to employ fins having tapered sidewalls (where the width of the fins at their base is greater than at the top of the fins). In that case, the fin trim (described below) below the trimmed fins hardmask can be performed to straighten the fin sidewalls—and thereby trim the fins.

Figure 24:
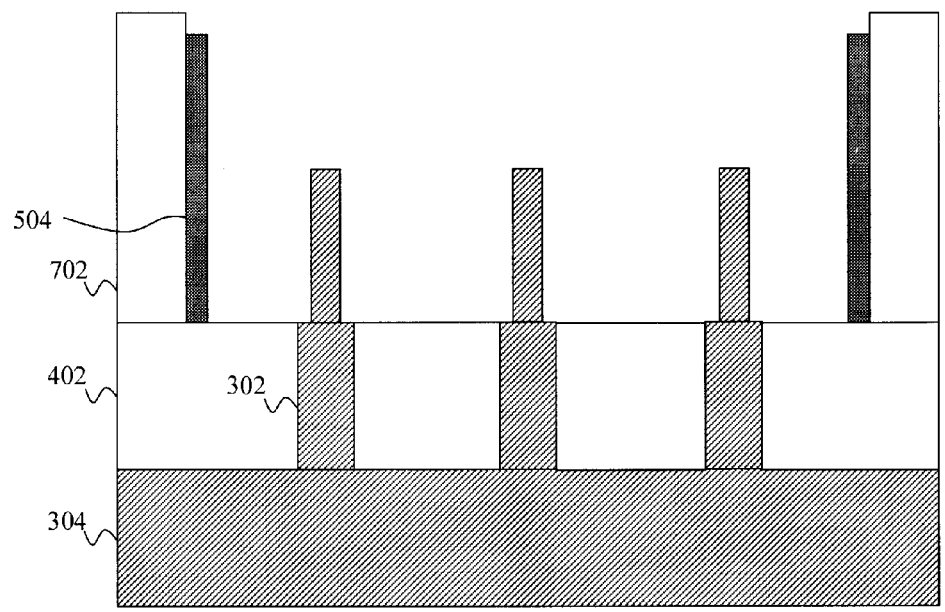
FIG. 24 is a cross-sectional diagram illustrating the fin hardmasks having been removed according to an embodiment of the present invention.

Next, as shown in FIG. 23, the fins 302 within the gate trench are trimmed beneath the (now trimmed) fin hardmasks. For detailed depictions of the fin hardmask trim, and then use of the trimmed hardmask subsequently in trimming the fins—see FIGS. 13 and 14, respectively. The same above-described fin trimming processes as described above may be employed to trim the fins. However, as shown in FIG. 23, the doped epitaxial cladding layer 2002 is removed from the fins within the gate trench during the fins trim. As provided above, the cladding is the same (or a very similar) material as the fins, just with doping. So the same etch can be used to remove the cladding and etch the fins within the gate trench. However, one could employ selectively etchable materials, such as a SiGe epitaxial cladding on Si fins, and then use a selective SiGe etch to remove the cladding from the fins in the gate trench—followed by trimming of the fins within the gate trench. Exemplary starting and ending (trimmed) fin width values were provided above. Following the fin trim, the fin hardmasks are removed. See FIG. 24.

The replacement gate stack formation process can then be carried out in the same manner as described above. The finFET device structure with the replacement gate stack would appear as shown illustrated in FIG. 16—described above.

Figure 25A:
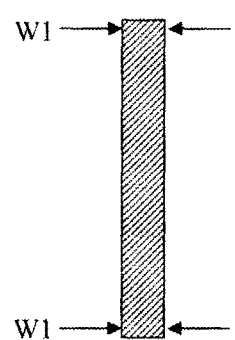
FIG. 25A is a cross-sectional diagram illustrating that the fin sidewalls can be straightened in the channel region such that a width of the fins is constant from a top to a bottom of each fin according to an embodiment of the present invention.
Figure 25B:
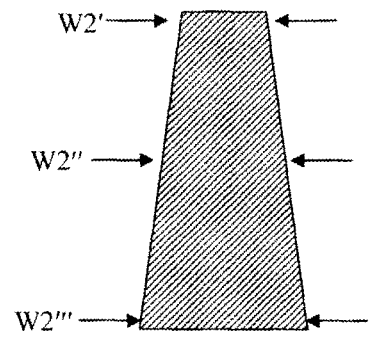
FIG. 25B is a cross-sectional diagram illustrating that the width of the fins outside of the gate stack might be tapered such that the width of the fins (outside of the gate stack) increases from the top to the bottom of each fin according to an embodiment of the present invention.

As provided above, it may be desirable to employ fins having tapered sidewalls adjacent to the gate stack (where the width of the fins at their base is greater than at the top of the fins) and provide less tapered sidewalls (as compared to a starting taper of the fins) in the channel region within the gate trench. In that case, as provided above, the fin hardmask which is left in place following the fin etch may be trimmed and then used to straighten the fin sidewalls. As a result, the fins have a width (W1) under the gate stack that may have little if any variation from the top to the bottom of each fin compared to a width (W2) of the fins adjacent to the gate stack which increases from the top to the bottom of each fin. See, for example, FIGS. 25A and 25B. FIGS. 25A and 25B are cross-sectional views through one of the fins under the gate stack (FIG. 25A) and adjacent to the gate stack (FIG. 25B) when the fin sidewalls have been straightened in the channel region. As shown in FIG. 25A, in the channel region the width of the fins may be the same at the top as at the bottom of the fin, a constant width W1. By comparison, as shown in FIG. 25B, adjacent to the gate stack the width of the fin increases from the top of the fin (e.g., width at top of fin is W1'), to the middle of the fin (e.g., the width at the middle of the fin is (W1")), to the bottom of the fin (e.g., the width at the bottom of the fin is (W1'")), wherein W1'<W1"<W1'". As a result, the length of the conduction path in the u-shaped channels increases from top to bottom. Notwithstanding, it is notable that the above general condition still applies that a width of the fins under the gate stack is less than the width of the fins adjacent to the gate stack.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming fin field-effect transistor (FET) devices, the method comprising the steps of:
    patterning fins in a wafer;
    forming a doped epitaxial cladding layer on the fins prior to forming dummy gates, wherein the doped epitaxial cladding layer is in-situ doped with an n-type or a p-type dopant;
    forming the dummy gates over portions of the fins that serve as channel regions of the finFET device;
    forming spacers on opposite sides of the dummy gates;
    depositing a gap fill oxide on the wafer, filling any gaps between the spacers;
    removing the dummy gates forming gate trenches;
    trimming the fins within the gate trenches such that a width of the fins within the gate trenches is less than the width of the fins under the spacers adjacent to the gate trenches, wherein u-shaped grooves are formed in sides of the fins within the gate trenches; and
    forming replacement gate stacks in the gate trenches over the portions of the fins that serve as the channel regions of the finFET devices, wherein portions of the fins adjacent to the replacement gate stacks serve as source and drain regions of the finFET devices.

2. The method of claim 1, wherein the doped epitaxial cladding layer comprises epitaxial silicon, germanium, or silicon germanium.

3. The method of claim 1, wherein the step of trimming the fins within the gate trenches removes at least a portion of the doped epitaxial cladding layer from the fins within the gate trenches.

4. The method of claim 1, wherein the width of the fins outside of the gate trenches is from about 7 nanometers to about 20 nanometers, and ranges therebetween.

5. The method of claim 1, wherein the width of the fins within the gate trenches is from about 3 nanometers to about 10 nanometers, and ranges therebetween.

6. The method of claim 1, wherein the dummy gates comprise poly-silicon.

7. The method of claim 1, wherein the step of forming the replacement gate stacks comprises the steps of:
    depositing a conformal gate dielectric material into and lining the gate trenches and covering the fins;
    depositing a conformal workfunction setting metal layer into the gate trenches on the conformal gate dielectric; and
    depositing a filler gate metal into and filling the gate trenches.

8. The method of claim 7, wherein the conformal gate dielectric includes a high-κ material selected from the group consisting of hafnium oxide and lanthanum oxide.

9. The method of claim 7, wherein the conformal workfunction setting metal layer comprises an n-type workfunction metal selected from the group consisting of: titanium nitride, tantalum nitride, and aluminum-containing alloys.

10. The method of claim 7, wherein the conformal workfunction setting metal layer comprises a p-type workfunction metal selected from the group consisting of: titanium nitride, tantalum nitride, and tungsten.

11. The method of claim 7, wherein the filler gate metal comprises tungsten or aluminum.

12. The method of claim 1, further comprising the step of:
    using a fin hardmask to pattern the fins in the wafer.

13. The method of claim 12, further comprising the step of:
    removing the fin hardmask from the fins prior to forming the dummy gates.

14. The method of claim 12, further comprising the steps of:
    trimming the fin hardmask prior to trimming the fins; and
    removing the fin hardmask after trimming the fins.

15. A method of forming fin FET devices, the method comprising the steps of:
    patterning fins in a wafer using a fin hardmask;
    forming a doped epitaxial cladding layer on the fins prior to forming dummy gates, wherein the doped epitaxial cladding layer is in-situ doped with an n-type or a p-type dopant;
    forming the dummy gates over portions of the fins that serve as channel regions of the finFET device;
    forming spacers on opposite sides of the dummy gates;
    depositing a gap fill oxide on the wafer, filling any gaps between the spacers;
    removing the dummy gates forming gate trenches;
    trimming the fin hardmask to a width smaller than a patterned width of the fins prior to trimming the fins;
    trimming the fins within the gate trenches such that a width of the fins within the gate trenches is less than the width of the fins under the spacers adjacent to the gate trenches, wherein u-shaped grooves are formed in sides of the fins within the gate trenches;
    removing the fin hardmask after trimming the fins; and
    forming replacement gate stacks in the gate trenches over the portions of the fins that serve as the channel regions of the finFET devices, wherein portions of the fins adjacent to the replacement gate stacks serve as source and drain regions of the finFET devices.

* * * * *